(12) United States Patent
Kato et al.

(10) Patent No.: US 7,800,889 B2
(45) Date of Patent: Sep. 21, 2010

(54) OUTDOOR APPARATUS

(75) Inventors: Masanori Kato, Tokyo (JP); Motokazu Sonohara, Tokyo (JP); Tadashi Yato, Gifu (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 0 days.

(21) Appl. No.: 12/501,898

(22) Filed: Jul. 13, 2009

(65) Prior Publication Data
US 2009/0273902 A1 Nov. 5, 2009

Related U.S. Application Data

(62) Division of application No. 10/583,407, filed as application No. PCT/JP2004/015603 on Oct. 21, 2004, now Pat. No. 7,595,976.

(51) Int. Cl.
H02B 1/26 (2006.01)
H02G 3/08 (2006.01)
H05K 7/20 (2006.01)
H01R 12/00 (2006.01)

(52) U.S. Cl. ........................ 361/641; 220/3.8; 361/600; 361/690; 361/692; 439/76.2

(58) Field of Classification Search .................. 361/600, 361/641, 692
See application file for complete search history.

(56) References Cited

U.S. PATENT DOCUMENTS

| | | | |
|---|---|---|---|
| 4,459,638 A | 7/1984 | Brehm et al. | |
| 5,574,254 A | 11/1996 | Mori et al. | |
| 6,046,904 A | 4/2000 | Kubat | |
| 6,072,115 A | 6/2000 | Inoue et al. | |
| 6,233,136 B1 * | 5/2001 | Peng | 361/600 |
| 6,521,821 B2 | 2/2003 | Makita et al. | |
| 6,629,619 B2 | 10/2003 | Sato et al. | |
| 6,774,309 B2 * | 8/2004 | Kasai | 174/66 |
| 6,879,483 B2 | 4/2005 | Johnson et al. | |
| 6,911,598 B2 | 6/2005 | Onizuka et al. | |
| 7,099,155 B2 | 8/2006 | Kobayashi et al. | |
| 7,165,979 B1 * | 1/2007 | Oka | 439/76.2 |
| 7,209,360 B1 * | 4/2007 | Yarza | 361/752 |
| 7,459,630 B2 * | 12/2008 | Pinol Pedret et al. | 174/50 |
| 7,639,476 B2 * | 12/2009 | Sasaki et al. | 361/641 |
| 7,642,542 B2 * | 1/2010 | Suzuki et al. | 257/13 |
| 7,671,275 B2 * | 3/2010 | Kubota | 174/50 |
| 2002/0084271 A1 | 7/2002 | Sato et al. | |
| 2005/0052845 A1 | 3/2005 | Breier | |
| 2006/0012947 A1 | 1/2006 | Nakata et al. | |
| 2006/0154499 A1 | 7/2006 | Naito et al. | |

FOREIGN PATENT DOCUMENTS

DE 14 65 247 5/1969

(Continued)

Primary Examiner—Gregory D Thompson
(74) Attorney, Agent, or Firm—Buchanan Ingersoll & Rooney PC

(57) ABSTRACT

An outdoor apparatus that incorporates a heat sink and has a box-shaped casing, having a plurality of aligned ventilation holes formed on an upper plate and a lower plate so as to oppose the heat sink, and wherein inter-hole portions that are portions of the upper plate between adjacent ventilation holes are recessed downward with respect to other portions of the upper plate.

4 Claims, 18 Drawing Sheets

FOREIGN PATENT DOCUMENTS

| | | |
|---|---|---|
| DE | 83 08 523 | 5/1983 |
| DE | 93 05 941 | 7/1993 |
| DE | 202 04 252 | 7/2003 |
| EP | 0 122 499 | 10/1984 |
| FR | 743204 | 3/1933 |
| JP | 63-46888 | 3/1988 |
| JP | 4-127682 | 11/1992 |
| JP | 5-1288 U | 1/1993 |
| JP | 2004-31481 | 1/2004 |

\* cited by examiner

ENLARGED VIEW OF A1 (PARTIAL SECTIONAL VIEW TAKEN ON D1-D1)

ENLARGED VIEW OF A2 (PARTIAL SECTIONAL VIEW TAKEN ON D2-D2)

ENLARGED VIEW OF A3 (PARTIAL SECTIONAL VIEW TAKEN ON D3-D3)

ENLARGED VIEW OF A5

ENLARGED VIEW OF A6

ENLARGED VIEW OF A7

ENLARGED VIEW OF A8

US 7,800,889 B2

OUTDOOR APPARATUS

CROSS REFERENCE TO RELATED APPLICATIONS

This is a Divisional of U.S. application Ser. No. 10/583,407, filed Jun. 20, 2006, now allowed, which is a 371 Application of International Application No. PCT/JP2004/015603, filed Oct. 21, 2004. The entire contents of each of these applications is incorporated herein by reference.

TECHNICAL FIELD

The present invention generally relates to an outdoor apparatus that is installed outdoors, such as a junction box or a power conditioner used in a solar power generation system, etc., and more specifically relates to an improvement in a rainwater-proof structure of an outdoor apparatus.

BACKGROUND ART

A solar power generation system includes a plurality of solar cell modules that are disposed on a roof, a junction box, in which the wiring from the solar cell modules are arranged together into one and from which the DC power from the solar cell modules is supplied to a power conditioner, and the power conditioner that converts the DC power from the junction box to AC power and links the AC power to a system power supply. Various electronic circuits such as a booster circuit, an inverter unit and the like are incorporated in the junction box and the power conditioner. Therefore, waterproofing measures are taken to prevent entry of rainwater into the interior of the junction box and the power conditioner.

A casing for such a type of junction box or power conditioner includes an outer box, a front face of which is open, and a lid that closes the front opening. Waterproofing measures are necessary to prevent entry of rainwater into the casing through gaps between the outer box and the lid.

With an arrangement disclosed in Patent Document 1, an upper surface 102 of an outer peripheral portion, forming a front opening 101 of an outer box 102, has mounted thereto a plate member 103 that protrudes from the upper surface 102 and has a bent guiding portion at the tip, an upper surface 104b of a lid 104 for closing the front opening 101 has mounted thereto an L-shaped plate member 105 that extends so as to protrude downward, and the entry of rainwater into the interior is prevented by surface contact of a surface 103a of the plate member 103 and a surface 105a of the plate member 105 as shown in FIG. 24.

Patent Document 1: Japanese Published Unexamined Patent Application No. 2004-31481 (FIG. 4)

DISCLOSURE OF INVENTION

Problem to be Solved by the Invention

With the structure explained in Patent Document 1, because the entry of rainwater into the interior is prevented by employing a plane-to-plane contact structure, rainwater can be sucked up due to a capillary phenomenon and can enter into the interior through the gaps between the planes, especially during a severe storm or a downpour.

The present invention has been made in view of the above issue and an object thereof is to provide an outdoor apparatus, with which the reliability of the waterproof function against the entry of rainwater is improved over a long term.

Means for Solving Problem

To solve the above problems and to achieve the above objects, according to an aspect of the present invention, an outdoor apparatus includes a box-shaped main casing body that has an opening formed at a front face and houses at least one electronic circuit board in an interior thereof; and a box-shaped front panel that covers the front opening of the main casing body, wherein an upper plate of the main casing body having a front face that protrudes upward and has a plate-like rearward protrusion that protrudes rearward from the upward protrusion, and the front panel having a bent portion that is bent substantially perpendicularly from a front panel upper plate that opposes the upward protrusion of the main casing body and contacts a tip of the rearward protrusion of the main casing body.

According to another aspect of the present invention, an outdoor apparatus includes a box-shaped main casing body that has an opening formed at a front face and that houses at least one electronic circuit board in an interior thereof; and a box-shaped front panel that covers the front opening of the main casing body, wherein each of a left side plate and a right side plate of the main casing body having formed thereon at least one protrusion that extends vertically and substantially contacts a corresponding side plate among a left side plate and a right side plate of the front panel According to still another aspect of the present invention, an outdoor apparatus includes a box-shaped main casing body that has an opening formed at a front face and that houses at least one electronic circuit board in an interior thereof; and a box-shaped front panel that covers the front opening of the main casing body, and each of a left side plate and a right side plate of the front panel having formed thereon at least one protrusion that extends vertically and substantially contacts a corresponding side plate among a left side plate and a right side plate of the main casing body.

According to still another aspect of the present invention, an outdoor apparatus includes a box-shaped main casing body that has an opening formed at a front face and that houses at least one electronic circuit board; and a box-shaped front panel that covers the front opening of the main casing body, and each of a left side plate and a right side plate of the main casing body having formed thereon at least one protrusion that extends vertically and substantially contacts a corresponding side plate among a left side plate and a right side plate of the front panel, and each of the left side plate and the right side plate of the front panel having formed thereon at least one protrusion that extends vertically and substantially contacts a corresponding side plate among the left side plate and the right side plate of the main casing body.

According to still another aspect of the present invention, an outdoor apparatus that incorporates a heat sink and has a box-shaped casing, having a plurality of aligned ventilation holes formed on an upper plate and a lower plate so as to oppose the heat sink, and wherein inter-hole margins of the upper plate of the casing that are formed between ventilation holes are recessed downward with respect to other portions of the upper plate.

According to still another aspect of the present invention, an outdoor apparatus includes a box-shaped main casing body that has an opening formed at a front face, houses a heat sink and at least one electronic circuit board in an interior thereof, and has the aligned ventilation holes formed on an upper plate and a lower plate so as to oppose the heat sink; the heat sink that is disposed at a rear portion of the main casing body and has a base plate and radiating portions; the electronic circuit board that is mounted on the base plate of the heat sink; a box-like inner cover that is positioned inside the main casing body and covers the electronic circuit board; and a box-shaped front panel that covers the front opening of the main casing body, wherein in the main casing body, a region in which the heat sink is disposed and which is exposed to an exterior via the ventilation holes is sealed with respect to a region in which the electronic circuit board is positioned, and an upper plate of the inner cover is inclined downward from a rear side to a front side.

Effect of the Invention

With one aspect of the present invention, because the front face of the upper plate of the main casing body is protruded upward, the plate-like rearward protrusion that protrudes rearward from the upper protrusion is provided, and the front panel has the bent portion that is bent substantially perpendicularly from the front panel upper plate that opposes the upper protrusion of the main casing body and contacts the tip of the plate-like rearward protrusion of the main casing body, a plane-to-line contact structure is arranged by which rainwater can be prevented definitely from being sucked up by the capillary phenomenon and entering into the interior of the main casing body as in the conventional waterproof structure based on plane-to-plane contact, and improved waterproof reliability can thus be provided even under severe storm conditions. Also with the present invention, because the structure is realized by bending and without mounting separate parts to the main casing body, there is little worry of water leakage occurring due to gaps between mounted parts.

With the next aspect of the present invention, because each of the left side plate and the right side plate of the main casing body has formed thereon at least one protrusion that substantially contacts the corresponding side plate among the left side plate and the right side plate of the front panel, gaps are eliminated from the lateral portions of the main casing body and the front panel. The entry of rainwater from the lateral portions is thereby prevented definitely and improved waterproof reliability can be provided even under severe storm conditions.

With the next aspect of the present invention, because each of the left side plate and the right side plate of the front panel has formed thereon at least one protrusion that substantially contacts the corresponding side plate among the left side plate and the right side plate of the main casing body, gaps are eliminated from the lateral portions of the main casing body and the front panel. The entry of rainwater from the lateral portions is thereby prevented definitely and improved waterproof reliability can be provided even under severe storm conditions.

With the next aspect of the present invention, because each of the left side plate and the right side plate of the main casing body has formed thereon at least one protrusion that substantially contacts the corresponding side plate among the left side plate and the right side plate of the front panel and each of the left side plate and the right side plate of the front panel has formed thereon at least one protrusion that substantially contacts the corresponding side plate among the left side plate and the right side plate of the main casing body, gaps are eliminated from the lateral portions of the main casing body and the front panel. The entry of rainwater from the lateral portions is thereby prevented definitely and improved waterproof reliability can be provided even under severe storm conditions.

With the next aspect of the present invention, because the portions (inter-hole margins) between the ventilation holes of the heat sink on the upper plate of the casing are depressed downward with respect to the other portions of the upper plate, a structure is realized with which the rainwater that collects on the upper plate drops downward readily and the rainwater that reaches the portions between the ventilation holes does not move readily in lateral directions but drops downward readily. The entry of rainwater into the interior of the casing from the upper portion of the heat sink is thus prevented and improved waterproof reliability can be provided even under severe storm conditions.

With the next aspect of the present invention, because the upper plate of the inner cover is inclined downward from the rear side to the front side, even if rainwater enters by chance toward the electronic circuit board side of the main casing body from the heat sink side or the upper portion of the casing, the entering rainwater can be made to flow immediately toward the front by the inclined upper plate, thereby preventing the entry of rainwater into the electronic circuit board area. Improved waterproof reliability can thus be provided even under severe storm conditions.

Figure 1:
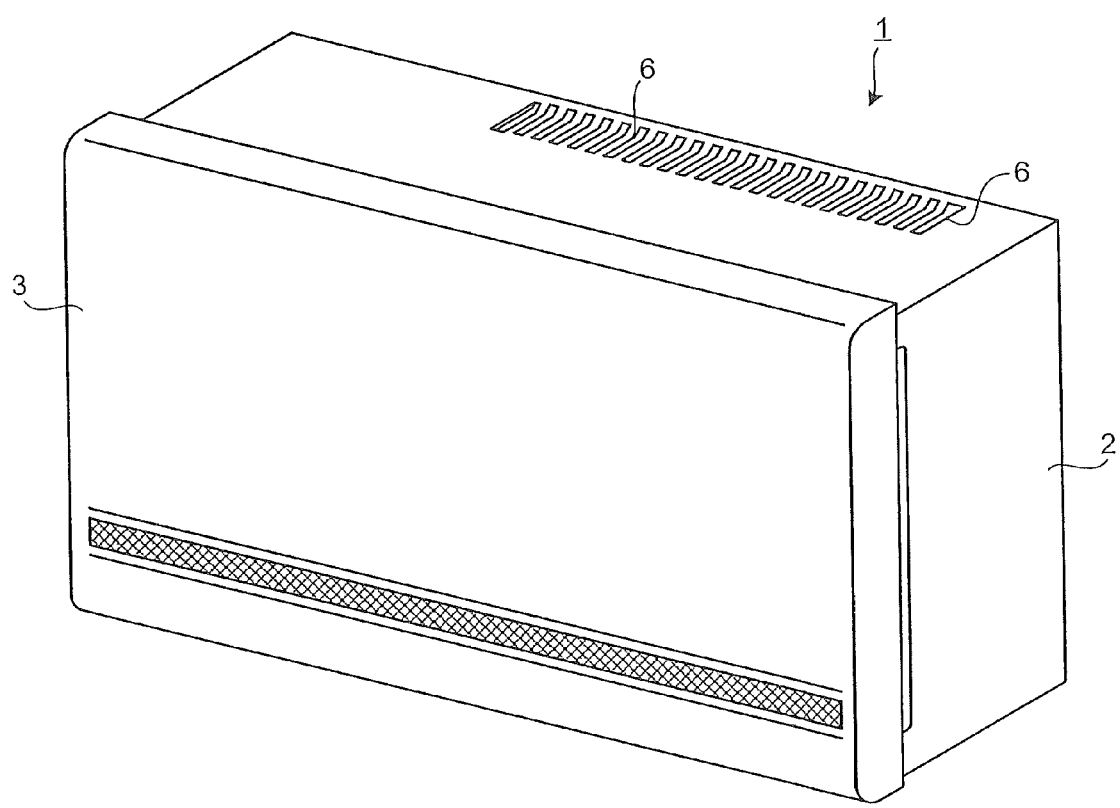
FIG. 1 is a perspective view of an external arrangement of a junction box according to an embodiment of the present invention.

EXPLANATIONS OF LETTERS OR NUMERALS 1 junction box
2 main casing body
3 front panel
4, 5 mounting hole
6, 7 ventilating hole
8a, 8b protrusion
10 heat sink
11, 11a radiating fin
12 base plate
13 foot
15 knockout hole
18 knockout hole
20 terminal block
21 switch
22 input terminal
23 output terminal
30 power circuit board
35 controlling circuit board
40 circuit board cover (inner cover)
41 label
50 terminal block cover
63 step
70, 71 packing
80, 81 caulking
90 small heat sink
91 power element
92 keel

BEST MODE(S) FOR CARRYING OUT THE INVENTION

Exemplary embodiments of an outdoor apparatus according to the present invention shall now be explained in detail based on accompanying drawings. The present invention is not restricted by the embodiments.

The embodiment of the present invention shall be explained with the help of FIG. 1 to FIG. 22. In the embodiments the invention is applied to a junction box (multi-array converter) used in a solar power generation system. As is well known, in a junction box, wirings from the solar cell modules are arranged together into one and connected to a power conditioner, moreover, the junction box has switches used in maintenance and inspection of the solar cell modules, a lightning arrester, a reverse flow preventing diode that prevents the reverse flow of electricity to the solar cell modules, a booster circuit that boosts DC power from the solar cell modules, etc.

Figure 2:
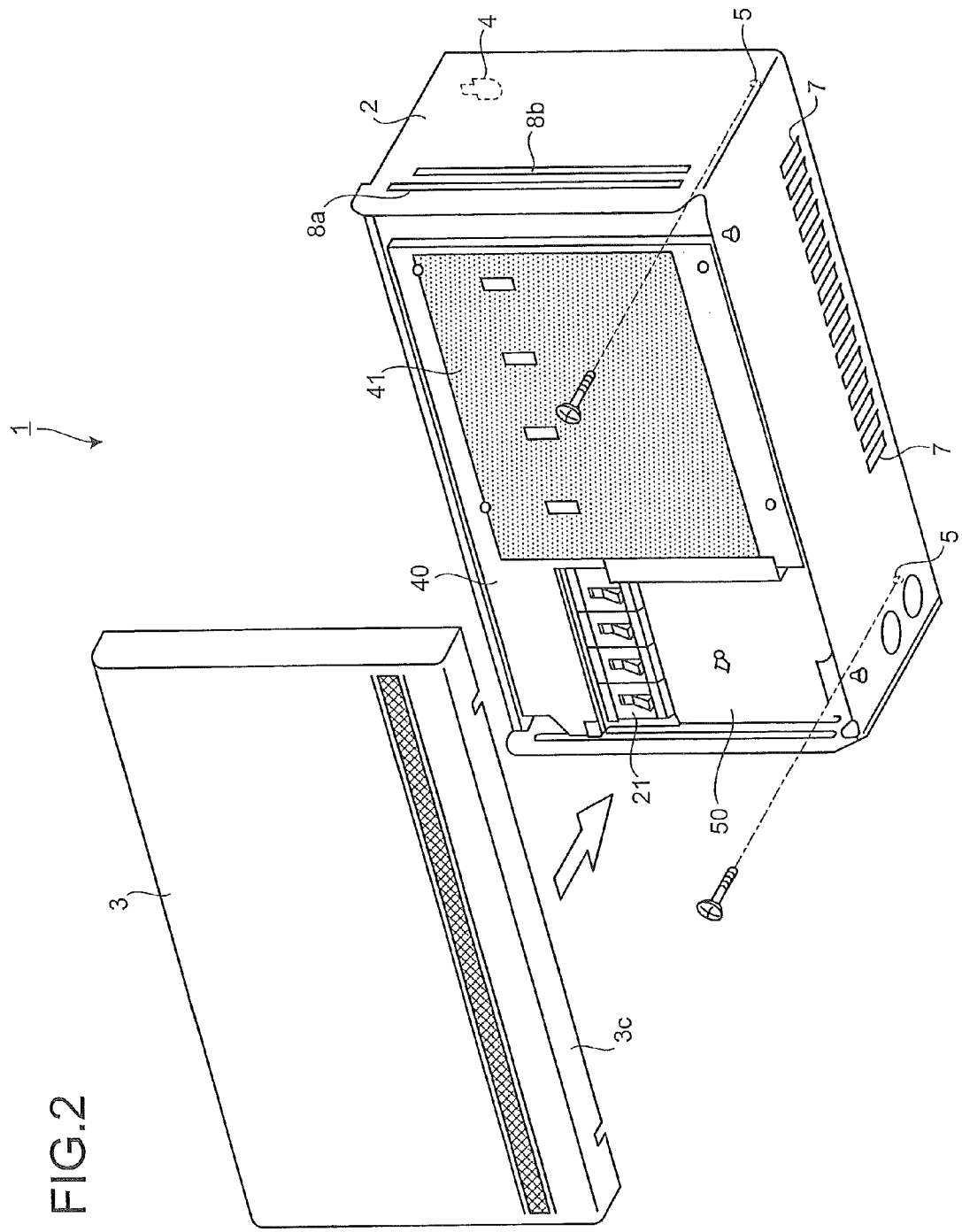
FIG. 2 is an exploded perspective view of a front panel and a main casing body.
Figure 3:
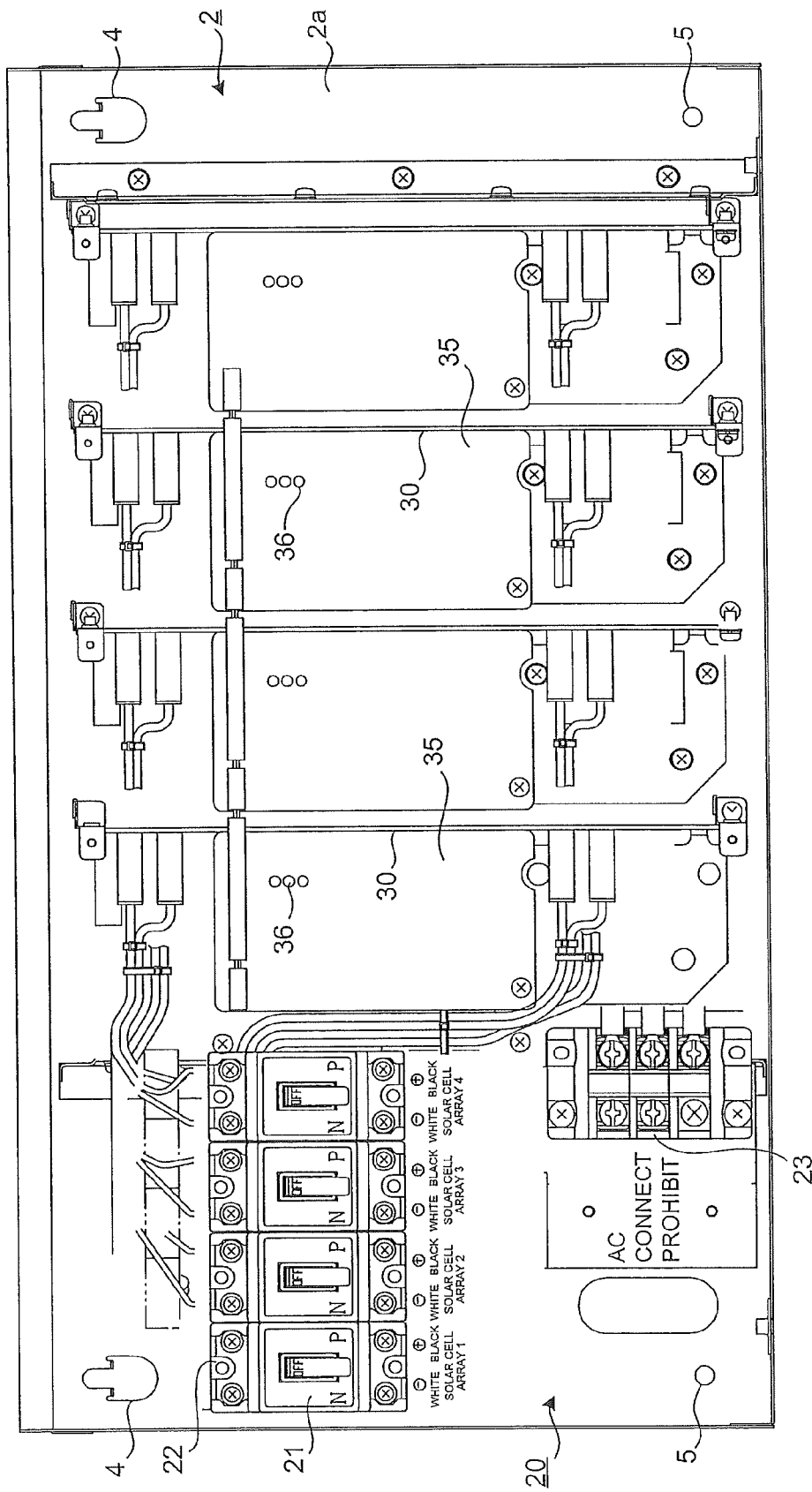
FIG. 3 is a front view of an internal structure of the main casing body in a state where an inner cover and a terminal block cover are removed.
Figure 4:
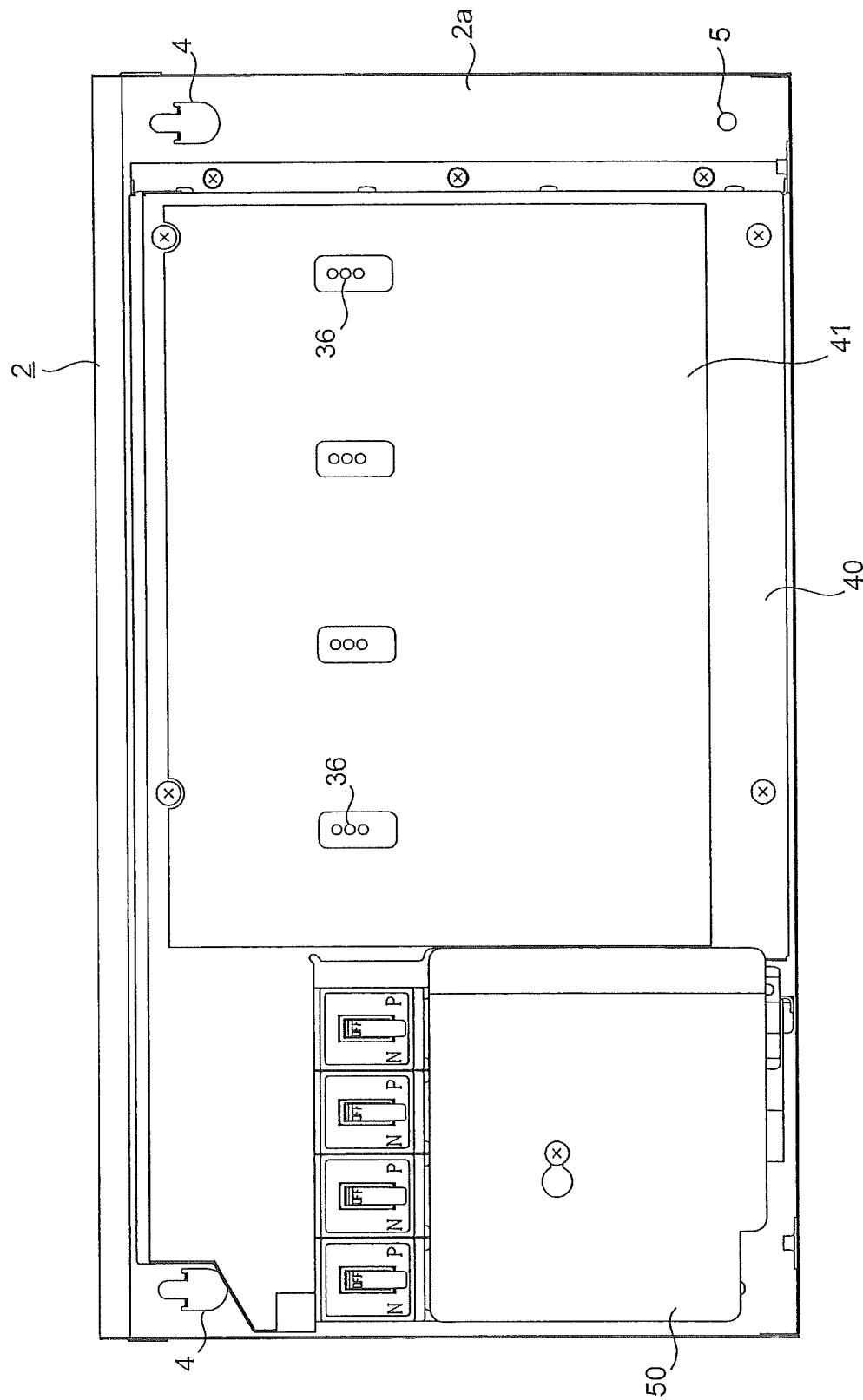
FIG. 4 is a front view of the internal structure of the main casing body in a state where the inner cover and the terminal block cover are mounted.
Figure 5:
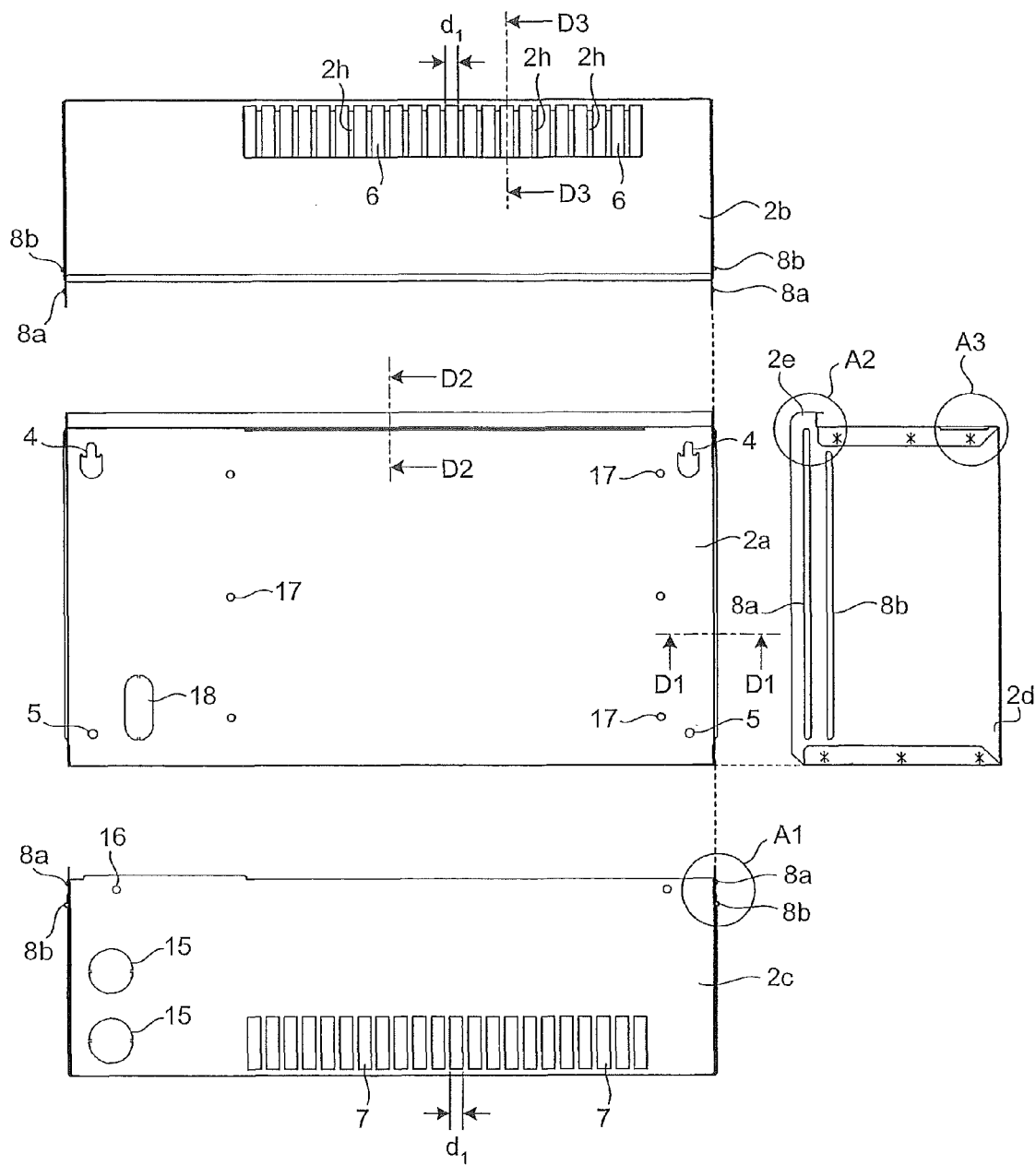
FIG. 5 is a four-view drawing of the main casing body as viewed from four sides.
Figure 6:
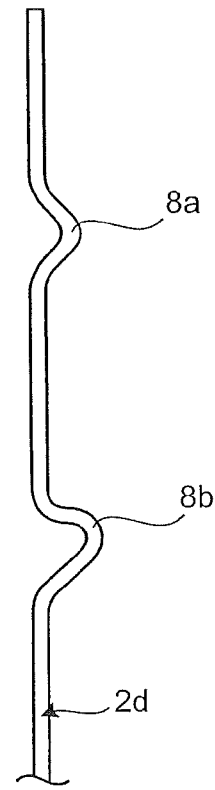
FIG. 6 is a partial sectional view taken on D1-D1 of details of an A1 portion of FIG. 5.
Figure 7:
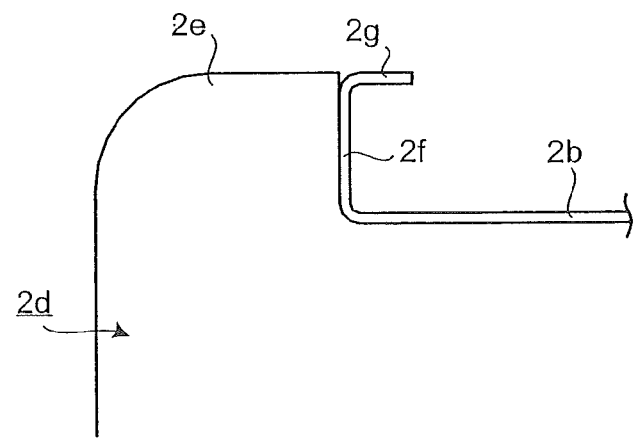
FIG. 7 is a partial sectional view taken on D2-D2 of details of an A2 portion of FIG. 5.
Figure 8:
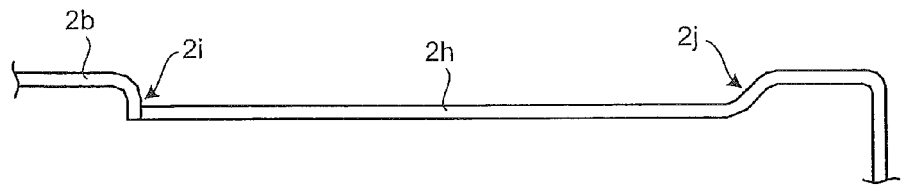
FIG. 8 is a partial sectional view taken on D3-D3 of details of an A3 portion of FIG. 5.
Figure 9:
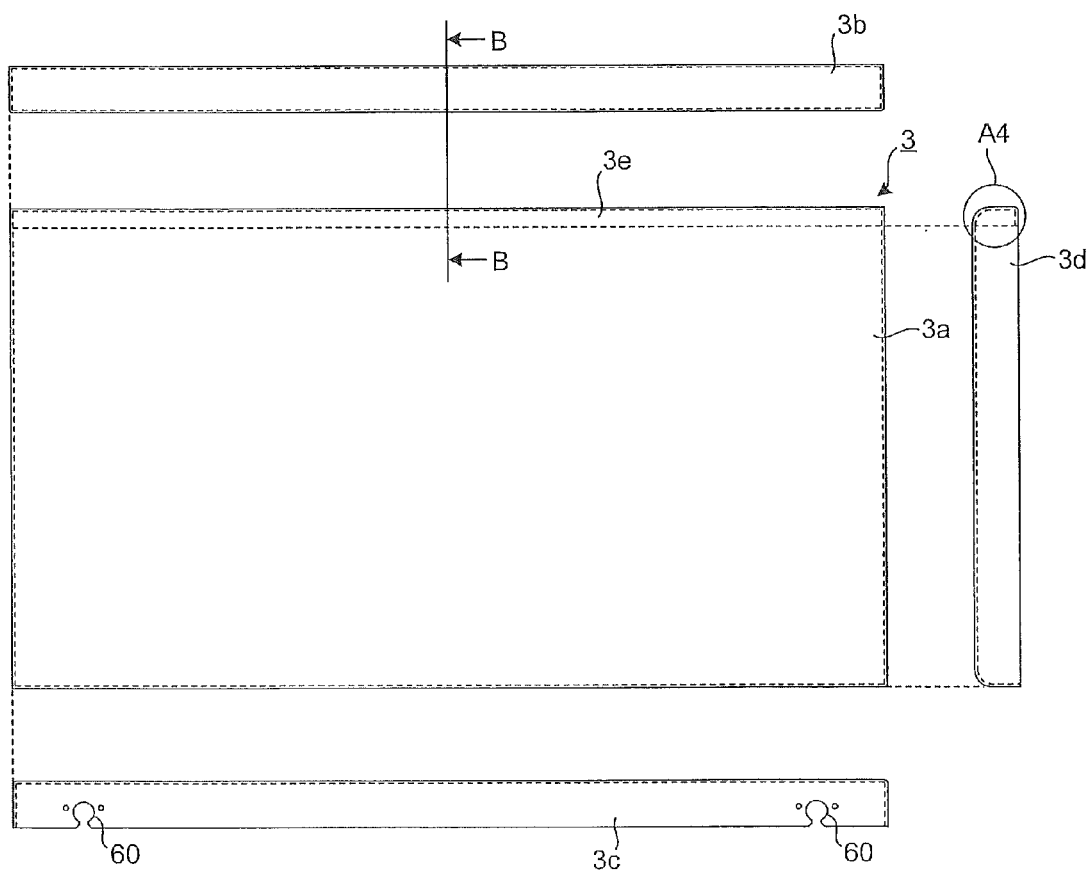
FIG. 9 is a three-view drawing of the front panel as viewed from three sides.
Figure 10:
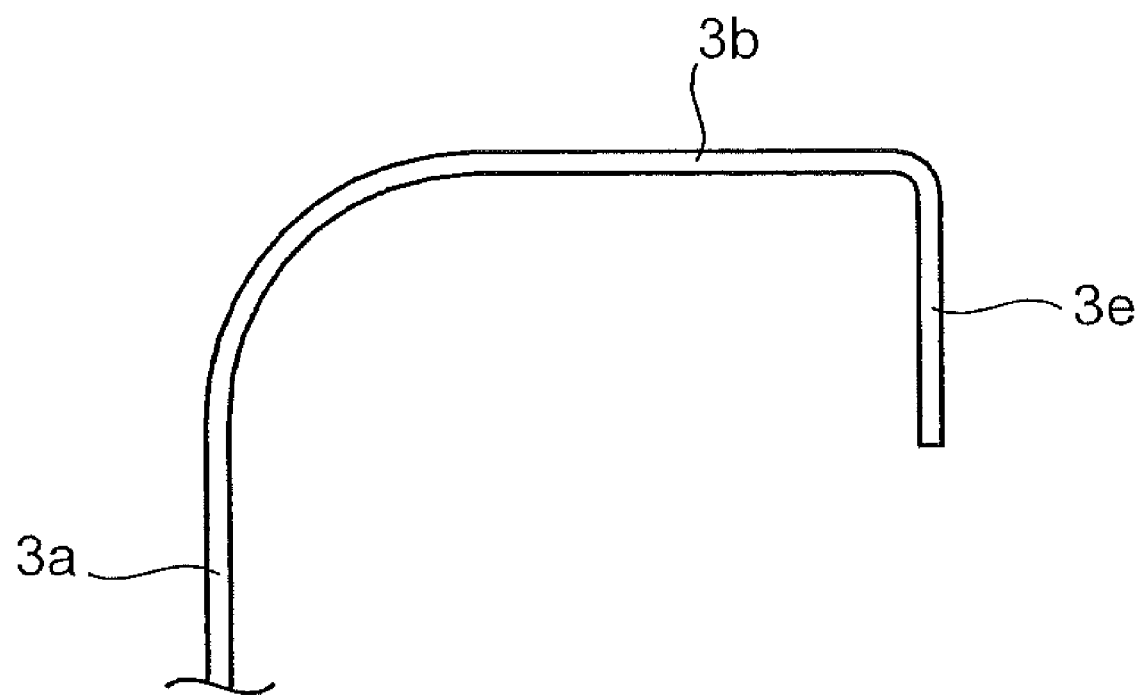
FIG. 10 is an enlarged sectional view taken on B-B of details of an A4 portion of FIG. 9.
Figure 11:
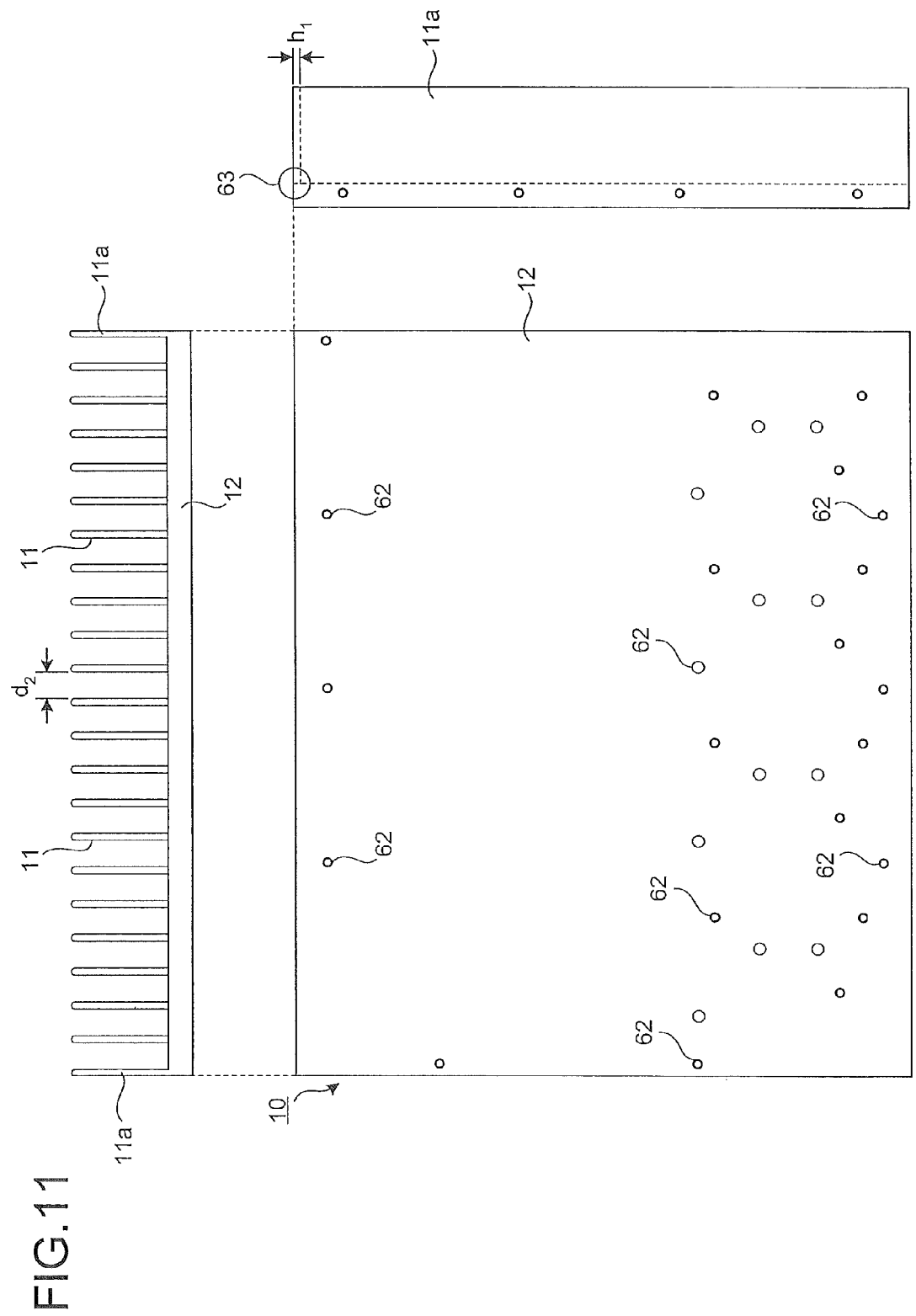
FIG. 11 is a three-view drawing of a heat sink as viewed from three sides.
Figure 12:
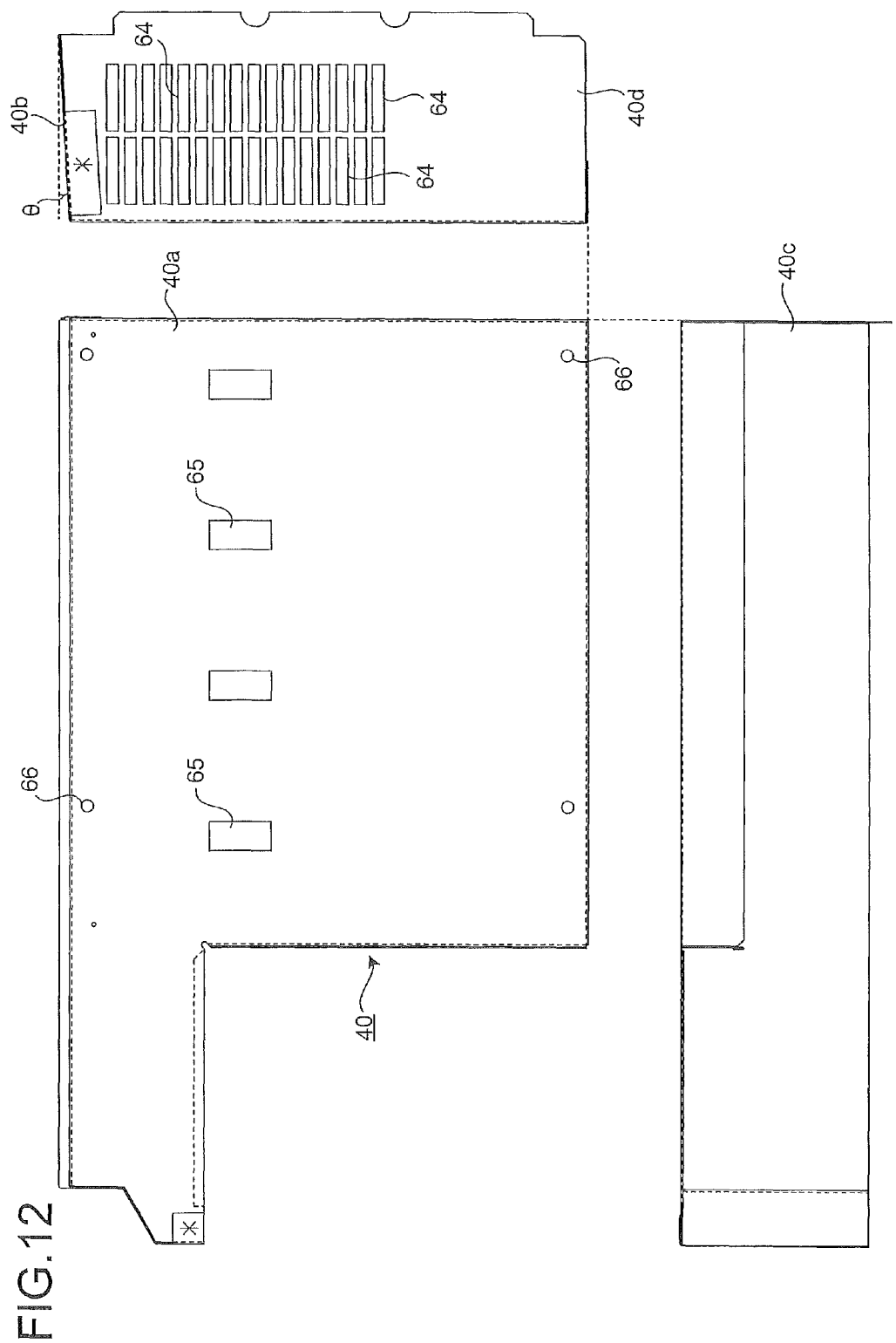
FIG. 12 is a three-view drawing of the inner cover as viewed from three sides.
Figure 13:
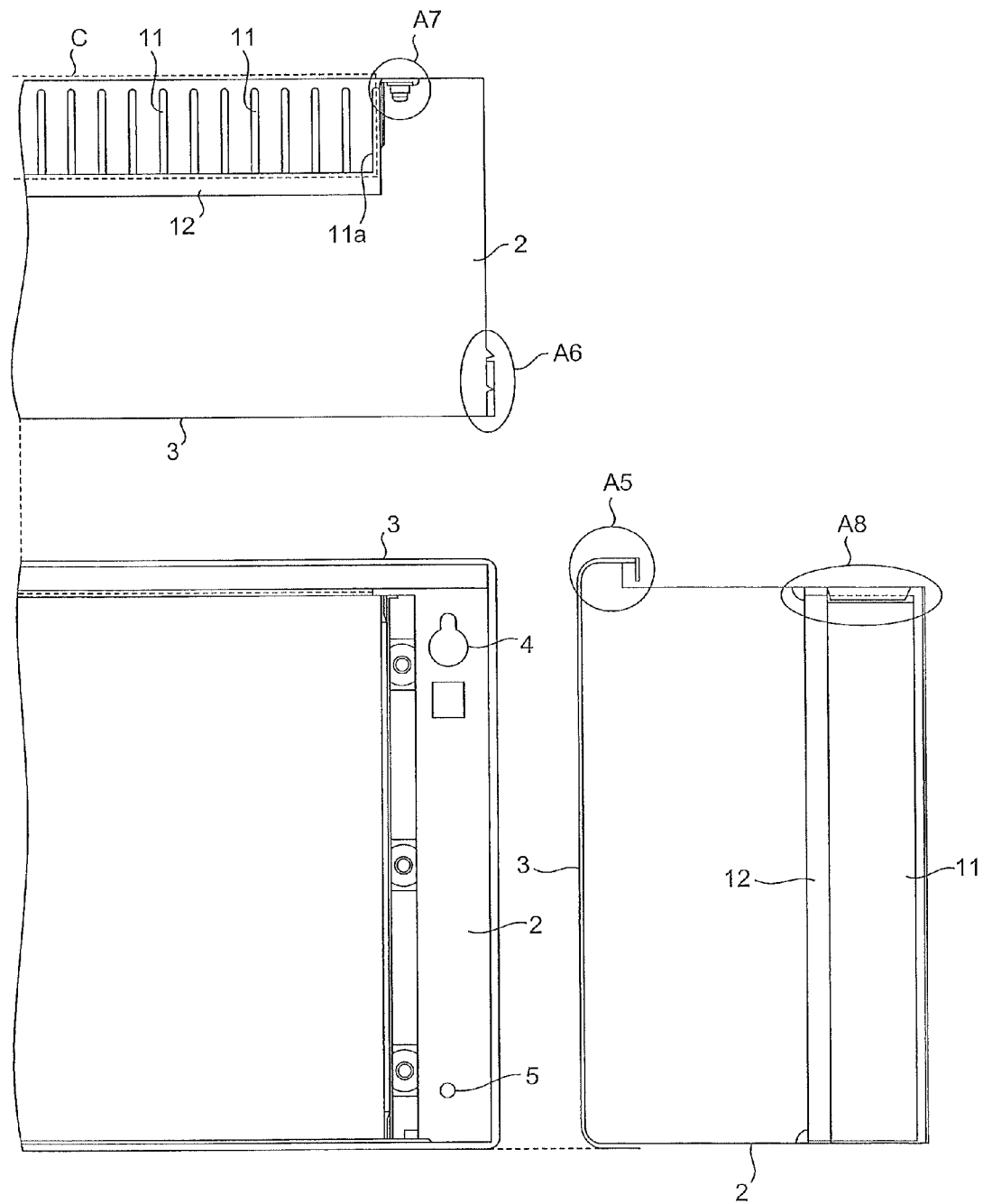
FIG. 13 is a three-view drawing as viewed from three sides of the junction box in a state where a heat sink front cover is mounted on the main casing body.
Figure 14:
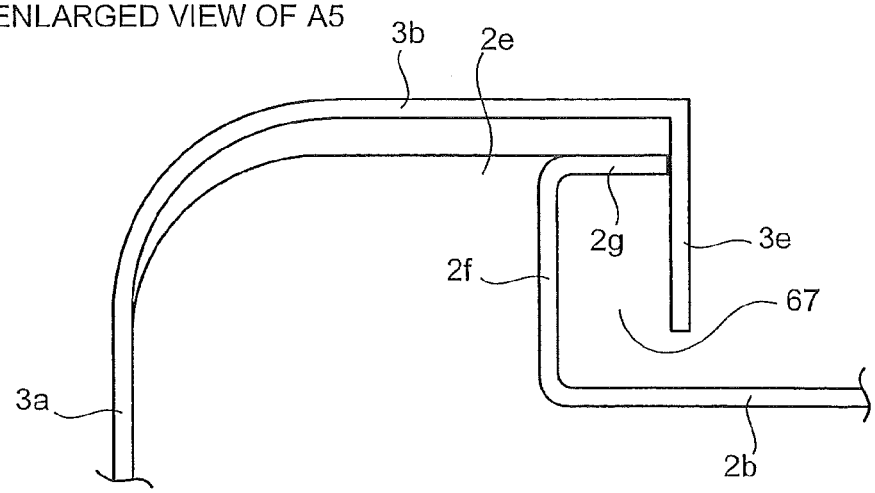
FIG. 14 is an enlarged sectional view of details of an A5 portion of FIG. 13.
Figure 15:
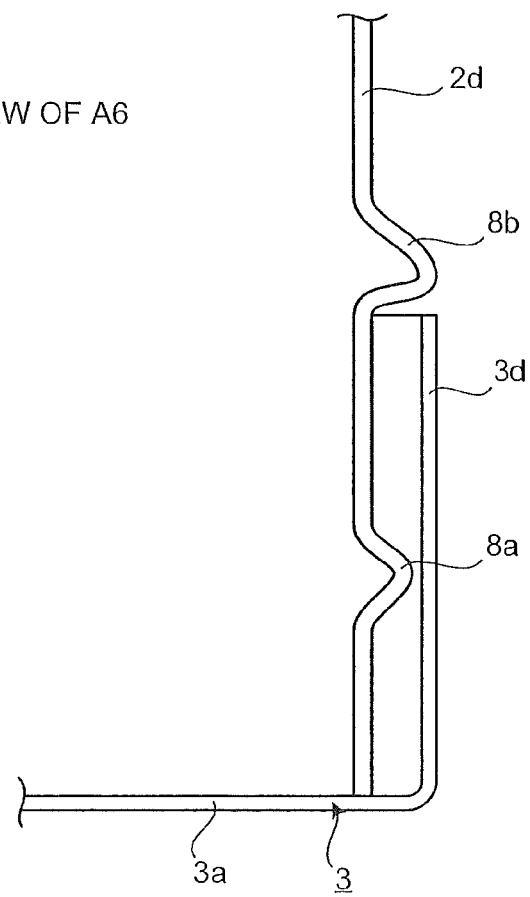
FIG. 15 is an enlarged sectional view of details of an A6 portion of FIG. 13.
Figure 16A:
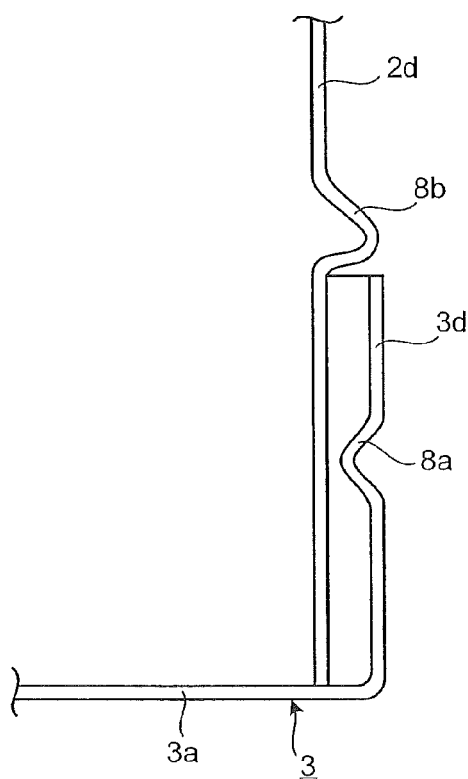
FIGS. 16A to 16D are enlarged sectional views of a modified form of a lateral waterproof structure.
Figure 16B:
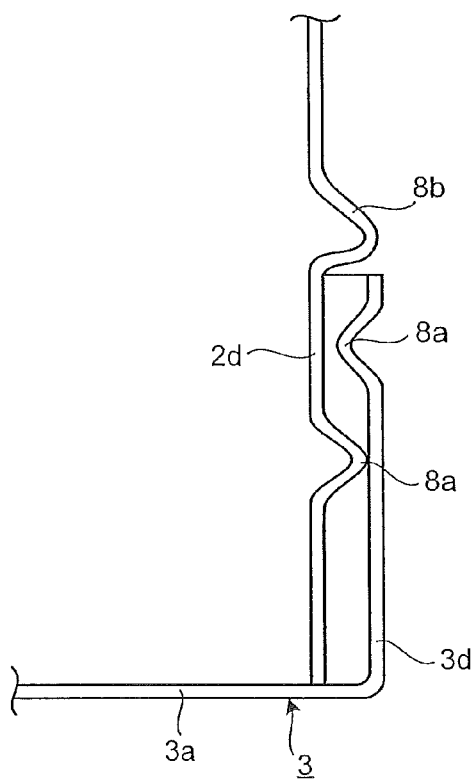
Figure 16C:
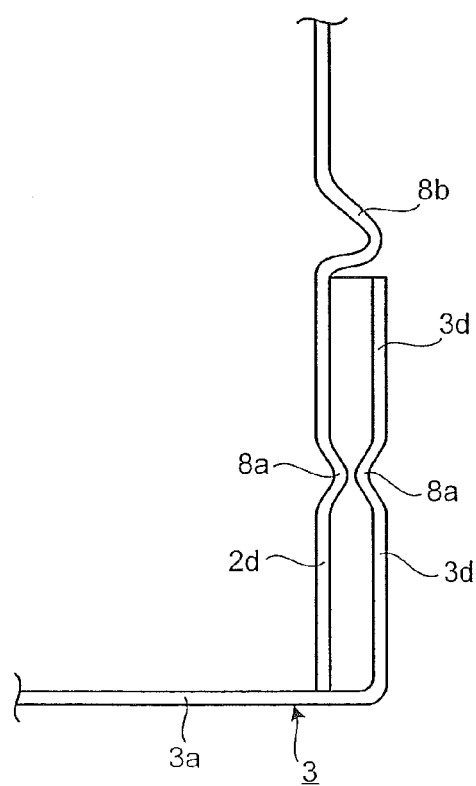
Figure 16D:
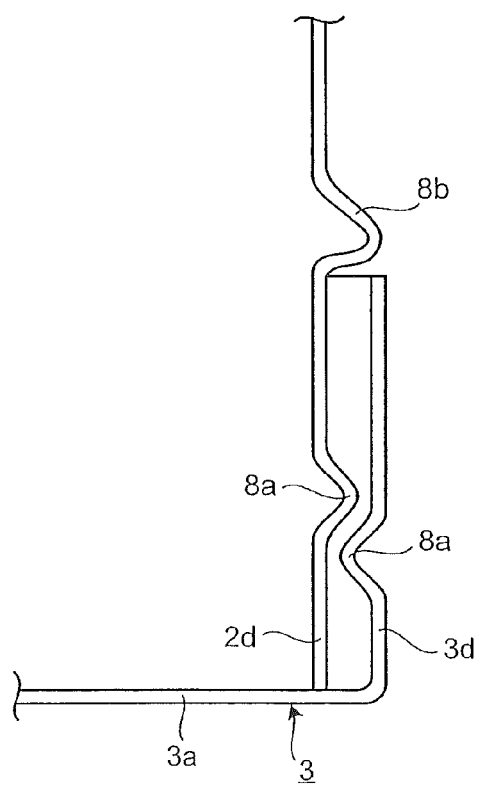
Figure 17:
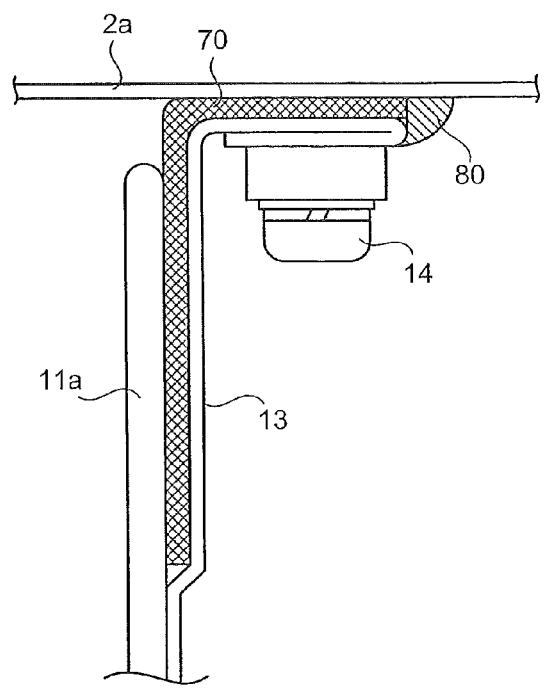
FIG. 17 is-an enlarged sectional view of details of an A7 portion of FIG. 13.
Figure 18:
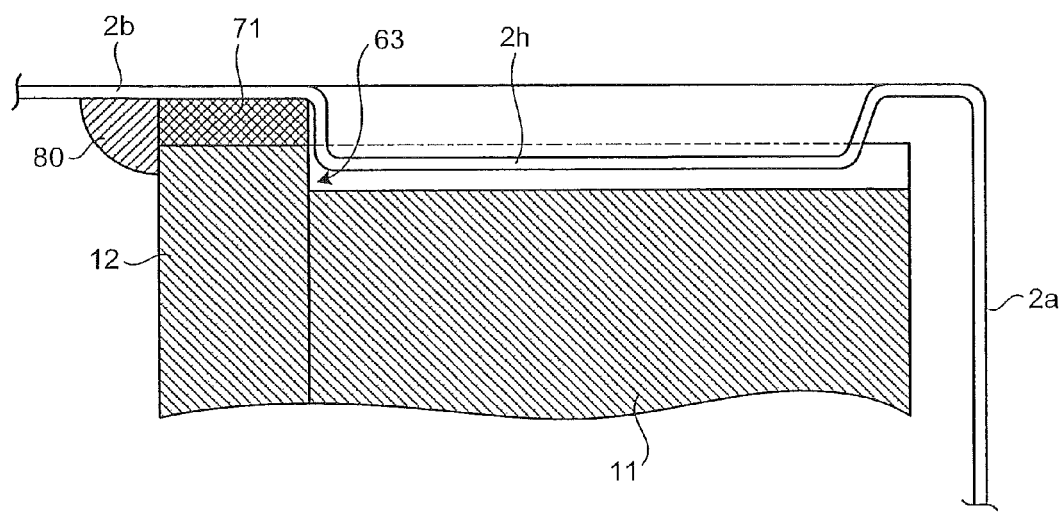
FIG. 18 is an enlarged sectional view of details of an A8 portion of FIG. 13.
Figure 19:
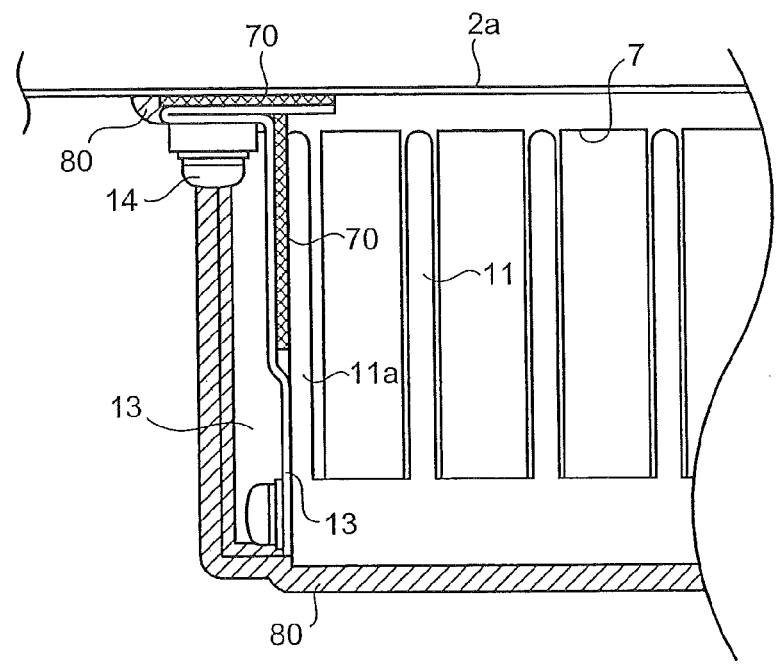
FIG. 19 is a sectional view of a sealing structure of the heat sink and the main casing body.
Figure 20:
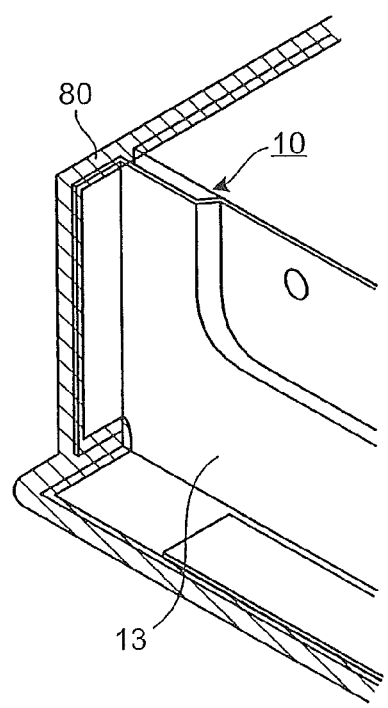
FIG. 20 is a perspective view for depicting a positioning of a sealing for the heat sink.
Figure 21:
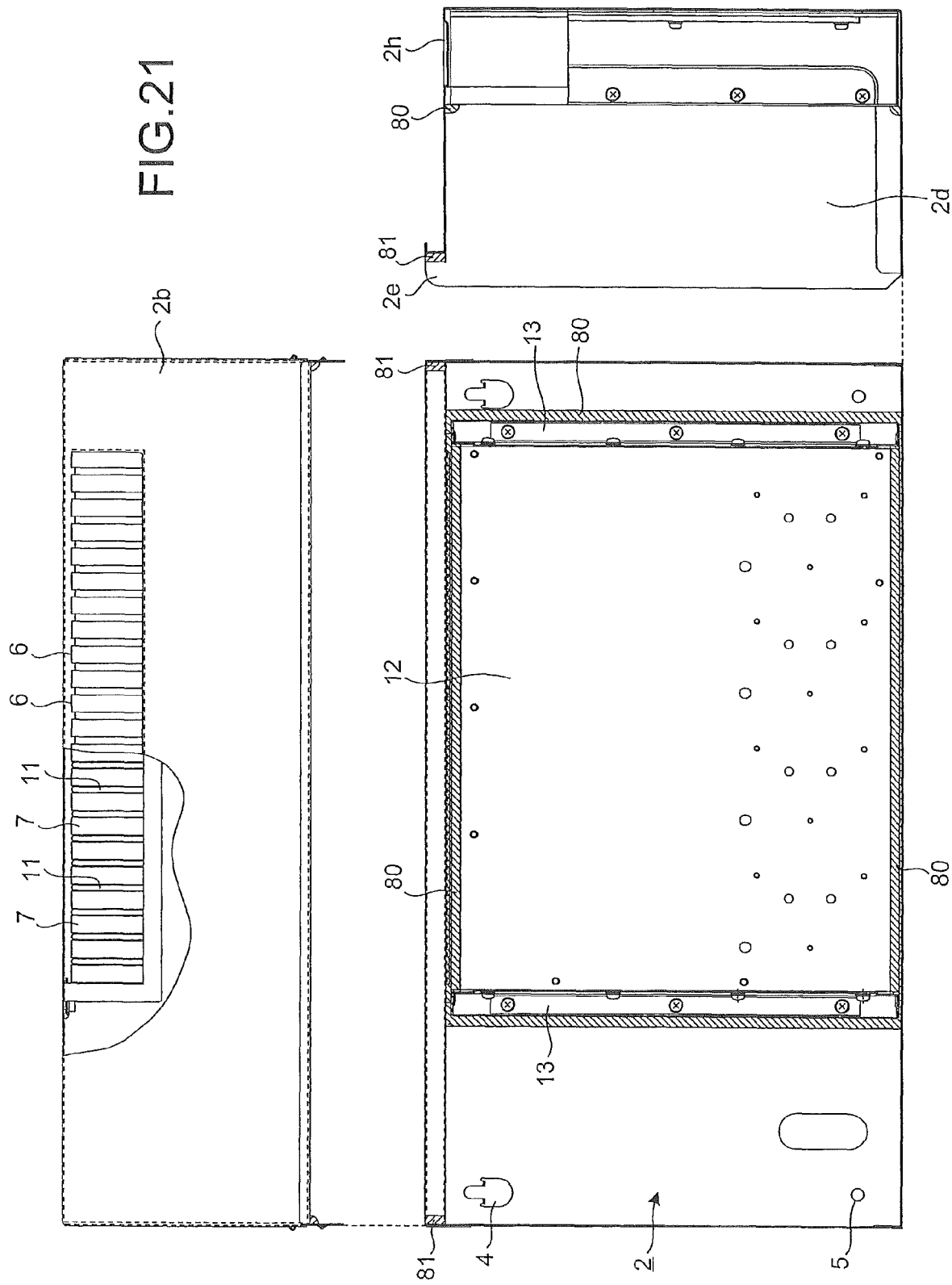
FIG. 21 is a three-view drawing of a sealing structure of the heat sink and the main casing body.
Figure 22:
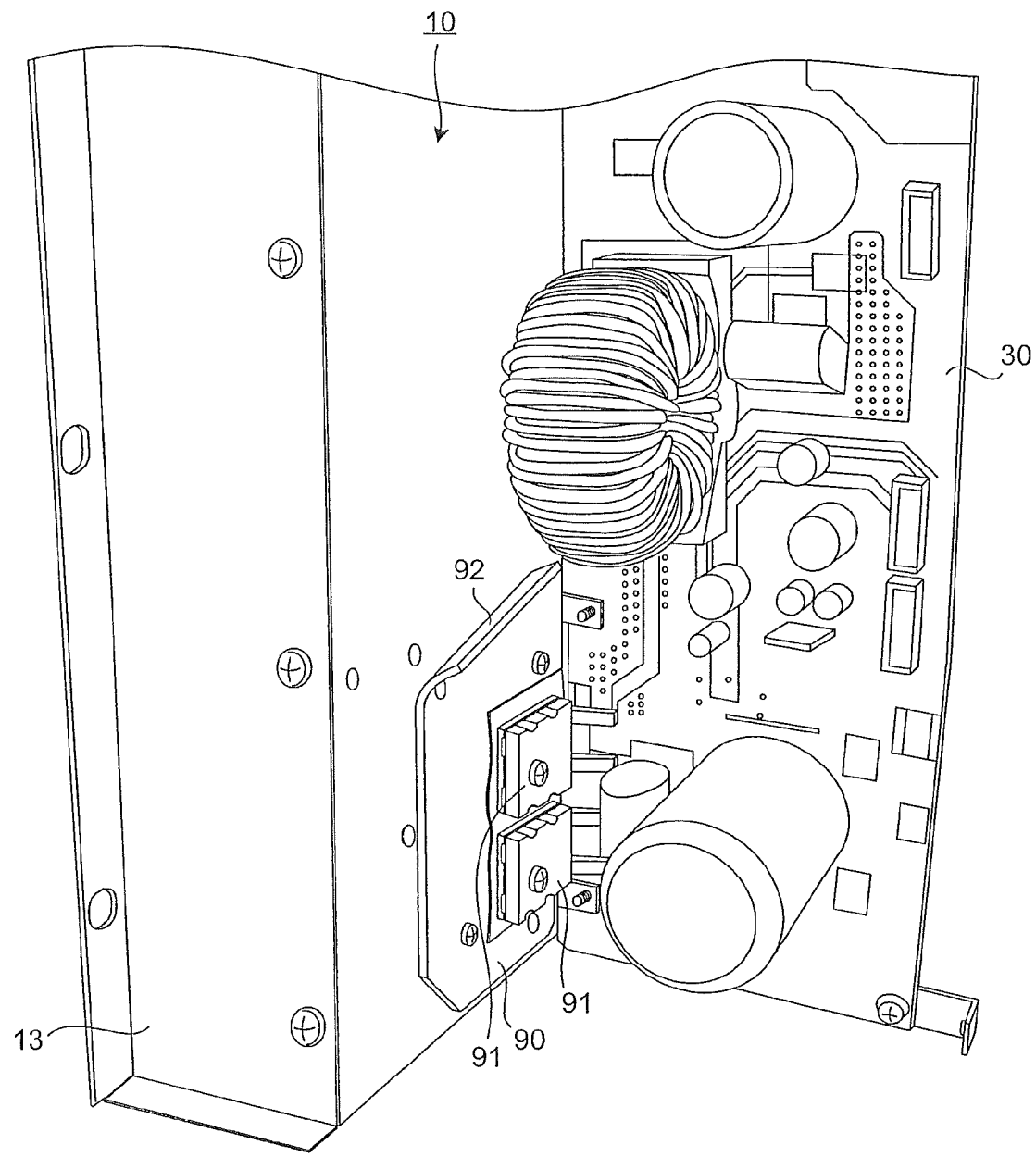
FIG. 22 is a perspective view of a mode of positioning of a power circuit board and a small heat sink with respect to the heat sink.
Figure 23:
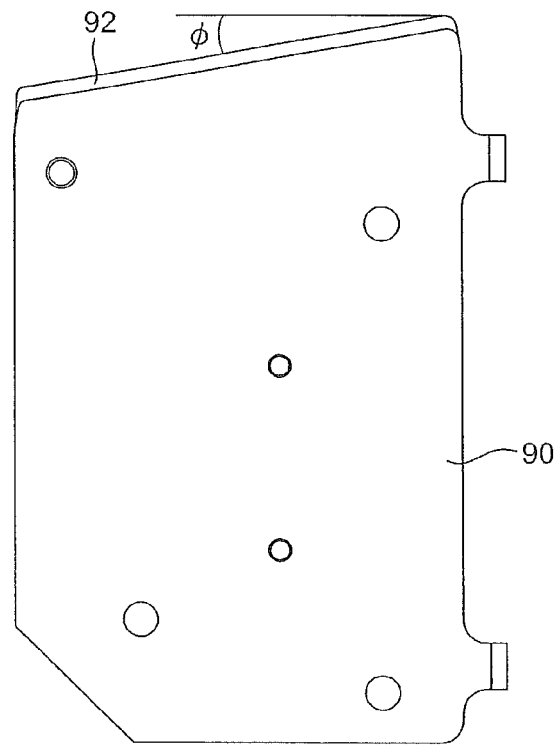
FIG. 23 is a front view of the small heat sink.
Figure 24:
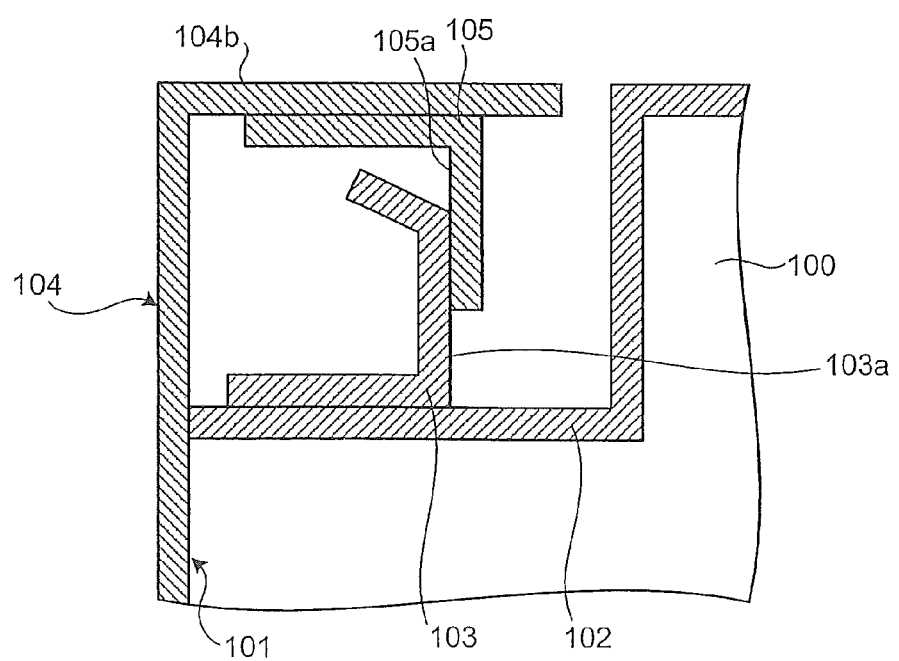
FIG. 24 is a sectional view of a conventional art.

FIG. 1 is a perspective view of an external arrangement of the junction box according to an embodiment of the present invention; FIG. 2 is an exploded perspective view of a front panel and a main casing body; FIG. 3 is a front view of an internal structure of the main casing body in a state where an inner cover and a terminal block cover are removed; FIG. 4 is a front view of the internal structure of the main casing body in a state where the inner cover and the terminal block cover are mounted; FIG. 5 is a four-view drawing of the main casing body as viewed from four sides; FIG. 6 is a partial sectional view taken on D1-D1 of details of an A1 portion of FIG. 5; FIG. 7 is a partial sectional view taken on D2-D2 of details of an A2 portion of FIG. 5; FIG. 8 is a partial sectional view taken on D3-D3 of details of an A3 portion of FIG. 5; FIG. 9 is a three-view drawing of the front panel as viewed from three sides; FIG. 10 is an enlarged sectional view taken on B-B of details of an A4 portion of FIG. 9; FIG. 11 is a three-view drawing of a heat sink as viewed from three sides; FIG. 12 is a three-view drawing of the inner cover as viewed from three sides; FIG. 13 is a three-view drawing as viewed from three sides of the junction box in a state where a heat sink front cover is mounted on the main casing body; FIG. 14 is an enlarged sectional view of details of an A5 portion of FIG. 13; FIG. 15 is an enlarged sectional view of details of an A6 portion of FIG. 13; FIGS. 16A to 16D are enlarged sectional views of a modified form of a lateral waterproof structure; FIG. 17 is an enlarged sectional view of details of an A7 portion of FIG. 13; FIG. 18 is an enlarged sectional view of details of an A8 portion of FIG. 13; FIG. 19 is a sectional view of a sealing structure of the heat sink and the main casing body; FIG. 20 is a perspective view for depicting a positioning of a sealing for the heat sink; FIG. 21 is a three-view drawing of a sealing structure of the heat sink and the main casing body; FIG. 22 is a perspective view of a mode of positioning of a power circuit board and a small heat sink with respect to the heat sink; and FIG. 23 is a front view of the small heat sink.

As shown in FIG. 1 and FIG. 2, a casing of a junction box 1 includes a substantially box-shaped metallic main casing body 2 that is open at a front face, and a substantially box-shaped metallic front panel 3 that serves as a lid member that covers the front opening of the main casing body 2. The junction box 1 is of a type that is installed on a wall, and the main casing body 2 is fixed to the wall by arranging screws in two mounting holes 4 that are formed in an upper side of a back plate 2a (see FIG. 3 and FIG. 5) of the main casing body 2 and two mounting holes 5 that are formed at a lower side of the back plate 2a.

A heat sink 10 for heat radiation, a terminal block 20, power circuit boards 30, controlling circuit boards 35, a metal inner cover (also referred to as "circuit board cover") 40, a metallic terminal block cover 50, etc., are incorporated in the main casing body 2. As shown in FIG. 13, etc., to be explained later, the heat sink 10 is positioned at a rear side of the main casing body 2 and, as shown in FIG. 3, the power circuit boards 30, the controlling circuit boards 35, and other electronic circuit boards are positioned at the front side of the main casing body 2.

FIG. 3 is the diagram of the interior of the main casing body 2 as viewed from the front in the state where the circuit board cover 40 and the terminal block cover 50 are removed, and in FIG. 3 are shown the (four in the present case) power circuit boards 30 and the (four in the present case) controlling circuit boards 35 that are positioned at the front side of the main casing body 2, and the terminal block 20 that is positioned at one side of the circuit boards. Here, the controlling circuit boards 35 are daughter boards of the power circuit boards 30 and are mounted perpendicular to the power circuit boards 30. One power circuit board 30 and one controlling circuit board 35 correspond to a single solar cell array, in which the solar cell modules are connected in series, and by the one power circuit board 30 and the one controlling circuit board 35, various electrical processes and control, such as a boosting operation, are executed on the single solar cell array. In FIG. 3, LEDs 36 are mounted on the respective controlling circuit boards 35 for notifying the operation states of the respective power circuit boards 30 and controlling circuit boards 35 according to each solar cell array.

As shown in FIG. 3, the terminal block 20 has a plurality of (four in the present case) switches 21, having input terminals 22, and output terminals 23 that are connected to the power conditioner, etc.

In FIG. 4, the substantially L-shaped circuit board cover 40 is mounted so as to cover the power circuit boards 30, the controlling circuit boards 35, and the peripheral electrical circuit portions, and the terminal block cover 50 is mounted so as to cover the terminal block 20. On top of the circuit board cover 40 is attached a label 41, on which are indicated the model name of the solar cell modules, a table of specifications of the power cell arrays, a cable wiring diagram, and other information. Transparent windows are formed in the circuit board cover 40 and the label 41 at positions corresponding to the LEDs 36 at the four locations so that the LEDs 36 can be checked even when the circuit board cover 40, with the label attached, is mounted.

The main casing body 2 shall now be explained using FIG. 5 to FIG. 8. On an upper plate 2b of the box-like main casing body 2 that is opened at the front face, a plurality of ventilation holes 6 are formed in parallel in correspondence to the position of the heat sink 10. A lower plate 2c of the main casing body 2 also has a plurality of ventilation holes 7 formed in parallel in correspondence to the position of the heat sink 10. The positional pitch of the ventilation holes 6 and 7 is made equal to the positional pitch of radiating fins 11 of the heat sink 10 to be explained below, and the ventilation with respect to the heat sink 10 is thereby improved. That is, hole width d1 of each of the ventilation holes 6 and 7 is made equal to an interval d2 (see FIG. 11) between the radiating fins 11 of the heat sink 10, the width of each radiating fin 11 is made equal to the interval between holes of the ventilation holes 6 and 7, and the heat sink 10 is mounted on the main casing body 2 so that the respective ventilation holes 6 and 7 directly oppose the gaps between the radiating fins 11 of the heat sink 10.

On the lower plate 2c of the main casing body 2 are formed knockout holes 15 for passing through protective tubes (not shown), containing exposed-wiring connecting cables to the solar cell array and the power conditioner, and screw holes 16 for fixing a lower plate 3c (see FIG. 2) of the front panel 3 by screws. On the back plate 2a of the main casing body 2 are formed, in addition to the mounting holes 4 and 5, mounting holes 17 for fixing the heat sink 10 by bolts and a knockout hole 18 for taking in a shielded wiring cable from the wall with respect to the solar cell array and the power conditioner.

Left and right side plates 2d of the main casing body 2 are formed so that their front sides protrude frontward with respect to the upper plate 2b and the lower plate 2c. As shown in FIG. 6, which is the sectional view taken on D1-D1 of the A1 portion, a protrusion 8a, formed by drawing by a die, extends vertically at a forwardly protruding portion of each of the left and right side plates 2d. Also, a protrusion 8b is formed parallel to the protrusion 8a. Although a detailed explanation using FIG. 15 shall be given later, the protrusions 8a and 8b function to prevent the entry of rainwater into the interior of the main casing body 2 from gaps at the respective lateral faces of the main casing body 2 and the front panel 3.

As shown in FIG. 7, a front upper portion (A2 portion) 2e of each of the left and right side plates 2d of the main casing body 2 protrudes upward with respect to the surface of side plate 2d. The front face of the upper protrusion 2e is curved to enable the front panel 3 to be mounted readily. As shown in FIG. 7, which is the sectional view taken on D2-D2, the front side of the upper plate 2b of the main casing body 2 is bent to a C-like shape. That is, an erect portion 2f that is erected upward is formed on the front face of the upper plate 2b of the main casing body 2, and a rearward protrusion 2g that protrudes rearward from the erect portion 2f is formed further at the tip. As shall be explained later in detail using FIG. 14, the rearward protrusion 2g functions to prevent the entry of rainwater into the interior of the main casing body 2 from gaps at upper portions of the main casing body 2 and the front panel 3.

As shown in FIG. 8, which is the sectional view taken on D3-D3 of the A3 portion, the ventilation holes 6 formed on the upper plate 2b of the main casing body 2 are formed at slightly downwardly recessed positions by a drawing process. That is, upper plate portions (referred to as "inter-hole margins") 2h, each of which is positioned between a ventilating hole 6 and an adjacent ventilating hole 6 on the upper plate 2b, are recessed with respect to other portions of the upper plate 2b, thereby forming steps 2i and 2j between the portions. Here, the step 2j at the rear is formed to have a gradual slope. By thus downwardly recessing the inter-hole margins 2h, a structure is provided with which the rainwater that enters the ventilation holes 6 is prevented from flowing in lateral directions and is drained downward readily.

The front panel 3 shall now be explained using FIG. 9 and FIG. 10. FIG. 10 is the sectional view taken on B-B of FIG. 9. The front panel 3 that has a substantially box-like shape includes a front plate 3a, an upper plate 3b, the lower plate 3c, and left and right side plates 3d. The lower plate 3c has formed therein mounting holes 60 for fixing the front panel 3 to the main casing body 2 by screws. At the tip of the upper plate 3b is provided a bent portion 3e that is bend substantially perpendicularly downward as shown in FIG. 10.

The heat sink 10 shall now be explained using FIG. 11. The heat sink 10 includes a base plate 12 and the radiating fins 11 that are erected on the base plate 12 and extend vertically. The base plate 12 has screw holes 62 formed therein for fixing the power circuit boards 30, etc.

Here, of the radiating fins, upper surfaces of the radiating fins 11 besides the two radiating fins 11a at the respective outer sides are positioned at positions that are lower by just a predetermined height hi than an upper surface of the base plate 12 so that steps 63 are formed between the upper surfaces of the radiating fins 11 and the upper surface of the base plate 12. By the structure, rainwater that has entered to the upper surfaces of the radiating fins 11 of the heat sink 10 is prevented from flowing in lateral directions and toward the various electronic circuit boards positioned at the front side of the main casing body 2, and the rainwater that has entered to the upper surfaces of the radiating fins 11 is drained downward readily.

The circuit board cover 40 shall now be explained using FIG. 12. The circuit board cover 40 has a substantially L-like box shape and includes a front plate 40a, an upper plate 40b, a lower plate 40c, and left and right side plates 40d. A plurality of ventilation holes 64 are formed in one of the side plates 40d. A plurality of transparent windows 65 that enable visual checking of the LEDs 36 of the controlling circuit boards 35 are formed in the front plate 40a. Also, a plurality of screw holes 66, for fixing the circuit board cover 40 to the main casing body 2 via, for example, the power circuit boards 30, are formed in the front plate 40a.

The depth dimensions of the upper plate 40b and the lower plate 40c are set so that the rear end of the circuit board cover 40 contacts the base plate 12 of the heat sink 10. Here, the upper plate 40b of the circuit board cover 40 is inclined downward at a predetermined angle θ from the rear side to the front side so that even if rainwater enters from the heat sink 10 side and the front side of the upper plate 2b of the main casing body 2 to the electronic circuit board side of the main casing body 2, the entering rainwater is made to flow frontward immediately by the upper plate 40b. The rainwater that has flowed frontward along the upper plate 40b of the circuit board cover 40 drops downward along the front plate 40a, and drops to the exterior through gaps between the lower plate 2c of the main casing body 2 and the lower plate 3c of the front panel 3.

The various waterproof structures of the junction box 1 shall now be explained in detail using FIG. 13 to FIG. 22. FIG. 13 is the schematic sectional view of the principal portions as viewed from three directions in a state in which the heat sink 10 is mounted on the interior of the main casing body 2 and the front panel 3 is mounted on the front face of the main casing body 2.

An upper waterproof structure between the main casing body 2 and the front panel 3 that is indicated by A5 in FIG. 13 shall first be explained using FIG. 14. As shown in FIG. 7, the erect portion 2f that is erected upward is formed at the front face of the upper plate 2b of the main casing body 2 and the plate-like rearward protrusion 2g that protrudes rearward from the erect portion 2f is formed further at the tip. Also as shown in FIG. 10, the bent portion 3e that extends substantially perpendicularly downward is formed at the tip of the upper plate 3b of the front panel 3. When the front panel 3 is mounted on the main casing body 2, the inner wall surface of the bent portion 3e of the front panel 3 contacts the tip portion of the rearward protrusion 2g of the main casing body 2, thereby providing a plane-to-line contact structure. Also, a space 67 of some height is formed below the portion of contact of the bent portion 3e and the rearward protrusion 2g.

With the waterproof structure, rainwater is definitely prevented from entering inside the main casing body by being sucked up by the capillary phenomenon as in the conventional waterproof structure based on plane-to-plane contact, and improved waterproof reliability can be provided even under severe storm conditions. Also, because the structure is realized by bending and without mounting separate parts to the main casing body, there is no worry of water leakage due to gaps between mounted parts.

A lateral waterproof structure between the main casing body 2 and the front panel 3 indicated by A6 in FIG. 13 shall now be explained using FIG. 15. As shown in FIG. 6, the two columns of the protrusions 8a and 8b, formed by a drawing process using a die, are formed on each of the left and right side plates of the main casing body 2. The protrusion 8b, which is positioned-near the tip of the side plate 3d of the front panel 3 and at the outer side when the front panel 3 is mounted on the main casing body 2, is provided to prevent the entry of rainwater from gaps between the lateral portions of the main casing body 2 and the front panel 3. The protrusion 8b thus preferably has a shape that protrudes as much as possible from the outer shape of the front panel 3 and closes the lateral gaps between the main casing body 2 and the front panel 3 as much as possible to a degree to which a gap at the protrusion 8a will not be enlarged by the deformation of the front panel 3.

Meanwhile the other protrusion 8a, which is positioned at the inner side, is provided to prevent the rainwater that has entered from the lateral gaps between the main casing body 2 and the front panel 3 from entering further inward. The gaps between the protrusions 8a and 8b and the side plates 3d of the front panel 3 are thus preferably made as small as possible and the protrusions 8a and 8b are preferably made to contact the side plates 3d of the front panel 3 to a degree such that the front panel 3 will not become deformed.

With the lateral waterproof structure, gaps at the lateral portions of the main casing body 2 and the front panel 3 are eliminated, the entry of rainwater from the lateral portions is prevented definitely, and improved waterproof reliability can be provided even under severe storm conditions.

The waterproofing can be improved further by forming a plurality of columns of each of the protrusions 8a and 8b. In this case, with the columns of the protrusion 8a that are formed at the inner side, it is sufficient that at least one column of the protrusion contact the side plate 3d of the front panel 3 substantially and the other protrusions do not necessarily have to contact the side plate 3d of the front panel 3.

Also, although the protrusion 8a is disposed on the main casing body 2 in the above, the same effects can be obtained by forming one or the columns of the protrusions 8a at the inner surface of the side plate 3d of the front panel 3 instead. Even in this case, it is sufficient that at least one column of the protrusion among the protrusions 8a provided on the inner surface of the side plate 3d of the front panel 3 contact the side plate 2d of the main casing body 2 substantially and the other protrusions do not necessarily have to contact the side plate 3d of the side plate 2d of the main casing body 2. Also as shown in FIGS. 16B to 16D, the same one or the protrusions 8a may be formed on both the main casing body 2 and the front panel 3. With the example of FIG. 16B, the protrusion 8a on the front panel 3 is positioned at the rear of the protrusion 8a on the main casing body 2 so that the front panel 3 is fitted onto the main casing body 2 upon being deformed. With the example of FIG. 16C, the protrusion 8a on the front panel 3 is formed so as to oppose the protrusion 8a on the main casing body 2, and because the height of each protrusion can be made low, warping and deformation of the metal plates (the main casing body 2 and the front panel 3) can be restrained. With the example of FIG. 16D, the protrusion 8a on the front panel 3 is positioned at the front of the protrusion 8a on the main casing body 2 so that the front panel 3 can be fitted onto the main casing body 2 without being deformed. By thus forming the one to the protrusions 8a on both the main casing body 2 and the front panel 3, a waterproofing effect equivalent to or better than that of the example explained above can be obtained.

A waterproof structure at a mounting portion of the heat sink 10 that is indicated by A7 in FIG. 13 shall now be explained using FIG. 17. Here, the heat sink 10 is fixed by screws 14 to the back plate 2a of the main casing body 2 by using legs 13 that are members separate from the heat sink 10. That is, legs 13 are fixed respectively to the radiating fins 11a at the respective outer sides at which the steps 63 are not formed and the legs 13 are fixed by the screws 14 to the back plate 2a of the main casing body 2. Here, by interposing packings 70 between the radiating fins 11a and the legs 13 and between the legs 13 and the back plate 2a of the main casing body 2, the sealing against rainwater is improved. Also at the outer side of each packing 70 is formed a caulking 80 that closes the gap between the leg 13 and the back plate 2a of the main casing body 2.

A waterproof structure at an upper portion of the heat sink that is indicated by A8 in FIG. 13 shall now be explained using FIG. 18. As mentioned above, with the heat sink 10, the upper surfaces of the radiating fins 11 are set at positions lower than the upper surface of the base plate 12 so that the steps 63 are formed between the upper surface of the base plate 12 and the upper surfaces of the radiating fins 11. Also as shown in FIG. 8, the ventilation holes 6 formed on the upper plate 2b of the main casing body 2 are formed at positions that are recessed downward by a drawing process. That is, each portion (inter-hole margin) 2h between the ventilating hole 6 and an adjacent ventilating hole 6 in the upper plate 2b is recessed with respect to the other portions of the upper plate 2b. Here, the height position of each inter-hole margin is lower than the upper surface of the base plate 12.

A packing 71 that serves as a sealing member is fitted between the upper surface of the base plate 12 of the heat sink 10 and the upper plate 2b of the main casing body 2, and as shall be explained later, the caulking 80 that serves as a sealing member is applied to locations at which the heat sink 10 contacts the main casing body 2 and at all gaps at which rainwater may enter. Thus with the junction box 1, although rainwater basically enters into a region C, which is indicated by broken lines in FIG. 13 and in which the radiating fins 11 of the heat sink are positioned, rainwater does not enter into regions besides the region. However, due to secular change and scattering in manufacturing, the packings and the caulking that serve as sealing members do not ensure the securing of complete sealing at all times.

Thus with the junction box 1, by forming the heat sink 10 so that the upper surfaces of the radiating fins 11 are lower in position than the upper surface of the base plate 12 and thereby forming the steps 63 between the upper surfaces of the radiating fins 11 and the upper surface of the base plate 12, rainwater that has reached the upper surfaces of the radiating fins 11 is made unlikely to enter to the upper surface of the base plate 12, that is, toward the packing 71 and is made to drop downward readily. When the upper surfaces of the radiating fins 11 are made the same in height as the upper surface of the base plate 12 and the steps 63 are thereby eliminated, the rainwater that has reached the upper surfaces of the radiating fins 11 flow in lateral directions (horizontal directions) without any obstruction and enter toward the packing 71 readily.

Also, the inter-hole margins 2h between ventilation holes 6 are recessed with respect to the other portions of the upper plate 2b, thereby forming a structure, with which the rainwater that collects on the upper plate 2b drops downward readily and the rainwater that has reached the inter-hole margins 2h is made unlikely to enter toward the upper face of the base plate 12, that is, toward the packing 71 and is made to drop downward readily. When the inter-hole margins 2h are not recessed but are made coplanar to the upper plate 2b, the rainwater that collects on the upper plate 2b does not drop downward readily and the rainwater that has reached the inter-hole margins 2h flows along the rear face of the inter-hole margins 2h and enters toward the packing 71. The inter-hole margins 2h are preferably recessed as deeply as possible. Also, when the heat sink 10, with the steps 63 formed as in the present embodiment, is employed, it is preferable from the standpoint of waterproofing to make the inter-hole margins 2h be recessed downward to positions lower than the upper surface of the base plate 12.

With the waterproof structure of the upper portion of the heat sink of the embodiment, because physical step structures that make rainwater drop downward readily and make it difficult for rainwater to enter in lateral directions are formed at the heat sink 10 and at ventilation hole portions at the upper side of the heat sink 10, even if the packings, caulking, and other sealing members degrade in sealing performance due to secular change or scattering in manufacturing, rainwater is made unlikely to enter into the interior of the main casing body 2.

The sealing structures of the heat sink portions, etc., shall now be explained using FIG. 19 to FIG. 21. FIG. 19 is the sectional view of the sealing structure between the heat sink 10, to which the leg 13 has been mounted, and the main casing body 2, FIG. 20 is the perspective view for depicting the positioning of the caulking with respect to the heat sink 10 to which the leg 13 has been mounted, and FIG. 21 is the three-view drawing for depicting the positioning of the caulking with respect to the heat sink 10, to which the leg 13 has been mounted, and the main casing body 2. As shown in these drawings, the caulking 80 is applied to the entire periphery of the heat sink 10 to eliminate gaps between the heat sink 10 and the main casing body 2 and prevent the entry of rainwater into inner portions of the main casing body 2. Also as shown in FIG. 21, a caulking 81 is applied to the inner side of the upper protrusions 2e of the left and right side plates 2d of the main casing body 2.

The waterproof structure at the electronic circuit board side shall now be explained using FIGS. 22 and 23. As mentioned above, various waterproofing measures are applied in the junction box 1, and the area, in which the power circuit boards 30, the controlling circuit boards 35, and other electronic circuit boards are mounted is coveted by the circuit board cover 40 having the upper plate 40b, which is inclined downward at the predetermined angle θ. from the rear side to the front side. Although rainwater will thus hardly enter into the area in which the electronic circuit boards are mounted, in preparation for the unlikely event that rainwater does enter, the following waterproofing measures are applied to the electronic circuit board mounting area.

As shown in FIG. 22, the power circuit boards 30 are mounted on the back surface of the base plate 12 of the heat sink 10. Also, power elements 91 of high-voltage drive that are large in heat generating amount, such as an IGBT (Insulated Gate Bipolar Transistor) that is electrically connected to the power circuit boards 30 are mounted on flat, small heat sink 90. Because entry of rainwater to such power elements 91 of high-voltage drive must be avoided as much as possible, a keel 92 is formed on an upper portion of the small heat sink 90, and as the keel 92, one that is not horizontal but is inclined to the left or right is employed. FIG. 23 is the plan view of the small heat sink with the keel 92 and here, the keel 92 is inclined at an angle Φ.

With the small heat sink 90 having the keel 92, the rainwater that enters into the area in which the electronic circuit boards are mounted and flow down along the back face of the base plate 12 of the heat sink 10 is stopped by the keel 92 and thereafter flows downward along the inclination of the keel 92. The entry of rainwater to the power elements 91 that are electronic circuits mounted on the heat sink 90 can thus be prevented definitely.

The present invention can be applied to a power conditioner of a solar power generation system that is intended to be installed outdoors. Furthermore, the present invention is not restricted to apparatuses used in solar power generation systems and may be applied to others apparatuses that are intended to be installed outdoors.

INDUSTRIAL APPLICABILITY

As explained above, the outdoor apparatus according to the present invention is useful as a junction box, a power conditioner of a solar power generation system, or any apparatus that is intended to be installed outdoors.

The invention claimed is:
1. An outdoor apparatus that incorporates a heat sink and has a box-shaped casing, having a plurality of aligned ventilation holes formed on an upper plate and a lower plate so as to oppose the heat sink, and
   wherein inter-hole portions that are portions of the upper plate between adjacent ventilation holes are recessed downward with respect to other portions of the upper plate.

2. The outdoor apparatus according to claim 1, wherein the heat sink includes a base plate; and a plurality of radiating fins that protrude from the base plate and extend vertically; and upper surfaces of the radiating fins are set to positions lower than an upper surface of the base plate so that steps are formed between the upper surface of the base plate and the upper surfaces of the radiating fins.

3. The outdoor apparatus according to claim 2, wherein the inter-hole portions are recessed downward with respect to other portions of the upper plate to positions lower than the upper surface of the base plate.

4. The outdoor apparatus according to claim 1, wherein the heat sink is fixed to the casing with separate legs, and sealing members are disposed between the legs and the heat sink and the casing.

* * * * *